US011052641B2

(12) United States Patent
Brennan et al.

(10) Patent No.: US 11,052,641 B2
(45) Date of Patent: Jul. 6, 2021

(54) MULTI-LAYER CARD AND FILM ASSEMBLY

(71) Applicant: DuPont Teijin Films U.S. Limited Partnership, Wilmington, DE (US)

(72) Inventors: William J. Brennan, Middlesbrough (GB); Felicity Child, Middlesbrough (GB)

(73) Assignee: DuPont Teijin Films U.S. Limited Partnership, Wilmington, DE (US)

( * ) Notice: Subject to any disclaimer, the term of this patent is extended or adjusted under 35 U.S.C. 154(b) by 0 days.

(21) Appl. No.: 16/609,411

(22) PCT Filed: May 8, 2018

(86) PCT No.: PCT/GB2018/051223
§ 371 (c)(1),
(2) Date: Oct. 29, 2019

(87) PCT Pub. No.: WO2018/206928
PCT Pub. Date: Nov. 15, 2018

(65) Prior Publication Data
US 2020/0189244 A1    Jun. 18, 2020

(30) Foreign Application Priority Data

May 8, 2017    (GB) .................................... 1707355

(51) Int. Cl.
*B32B 27/08*    (2006.01)
*B32B 27/20*    (2006.01)
(Continued)

(52) U.S. Cl.
CPC .............. *B32B 27/08* (2013.01); *B32B 27/20* (2013.01); *B32B 27/304* (2013.01); *B32B 27/36* (2013.01);
(Continued)

(58) Field of Classification Search
CPC ............ B32B 2250/02; B32B 2250/03; B32B 2250/04; B32B 2250/05; B32B 2250/24;
(Continued)

(56) References Cited

U.S. PATENT DOCUMENTS

2005/0003962 A1*    1/2005    Brennan ................. B32B 27/20
503/227

* cited by examiner

*Primary Examiner* — Lawrence D Ferguson
(74) *Attorney, Agent, or Firm* — Wolf, Greenfield & Sacks, P.C.

(57) ABSTRACT

A multi-layer card comprising a polymeric inlay layer having a first surface and a second surface, further comprising a first multi-layer film which is disposed on the first surface of the polymeric inlay layer, and further comprising a first polymeric overlay layer which is disposed on said first multi-layer film, such that the layer order is polymeric inlay layer, first multi-layer film and first polymeric overlay layer, wherein said first multi-layer film comprises: (i) a polyester base layer (B) comprising a crystallisable polyester ($P_B$), and further comprising titanium dioxide in an amount of from about 1 to about 30 wt % by total weight of the base layer; (ii) a first heat-sealable copolyester layer (A1) disposed on a first surface of said polyester base layer; and (iii) optionally a second heat-sealable copolyester layer (A2) disposed on a second surface of said polyester base layer, wherein the copolyester ($CP_A$) of each of the first and optional second heat-sealable copolyester layers is independently selected from amorphous copolyesters ($ACP_A$) derived from an aliphatic diol and a cycloaliphatic diol and at least one aromatic dicarboxylic acid, and/or the polyester base layer (B) further comprises a copolyester ($CP_B$) in an amount of at least about 10% by weight based on the total weight of the base layer (B).

20 Claims, 1 Drawing Sheet

(51) Int. Cl.
*B32B 27/30* (2006.01)
*B32B 27/36* (2006.01)

(52) U.S. Cl.
CPC ....... *B32B 2250/05* (2013.01); *B32B 2250/24* (2013.01); *B32B 2264/102* (2013.01); *B32B 2270/00* (2013.01); *B32B 2307/31* (2013.01); *B32B 2307/402* (2013.01); *B32B 2307/41* (2013.01); *B32B 2307/412* (2013.01); *B32B 2307/518* (2013.01); *B32B 2307/702* (2013.01); *B32B 2307/704* (2013.01); *B32B 2307/75* (2013.01); *B32B 2425/00* (2013.01)

(58) Field of Classification Search
CPC .......... B32B 2250/244; B32B 2255/10; B32B 2255/20; B32B 2255/26; B32B 2255/28; B32B 2264/102; B32B 2270/00; B32B 2307/31; B32B 2307/40; B32B 2307/402; B32B 2307/4023; B32B 2307/4026; B32B 2307/41; B32B 2307/412; B32B 2307/518; B32B 2307/702; B32B 2307/704; B32B 2307/75; B32B 2425/00; B32B 27/08; B32B 27/16; B32B 27/20; B32B 27/304; B32B 27/36; B32B 27/365; B32B 7/10; H01L 23/49855
See application file for complete search history.

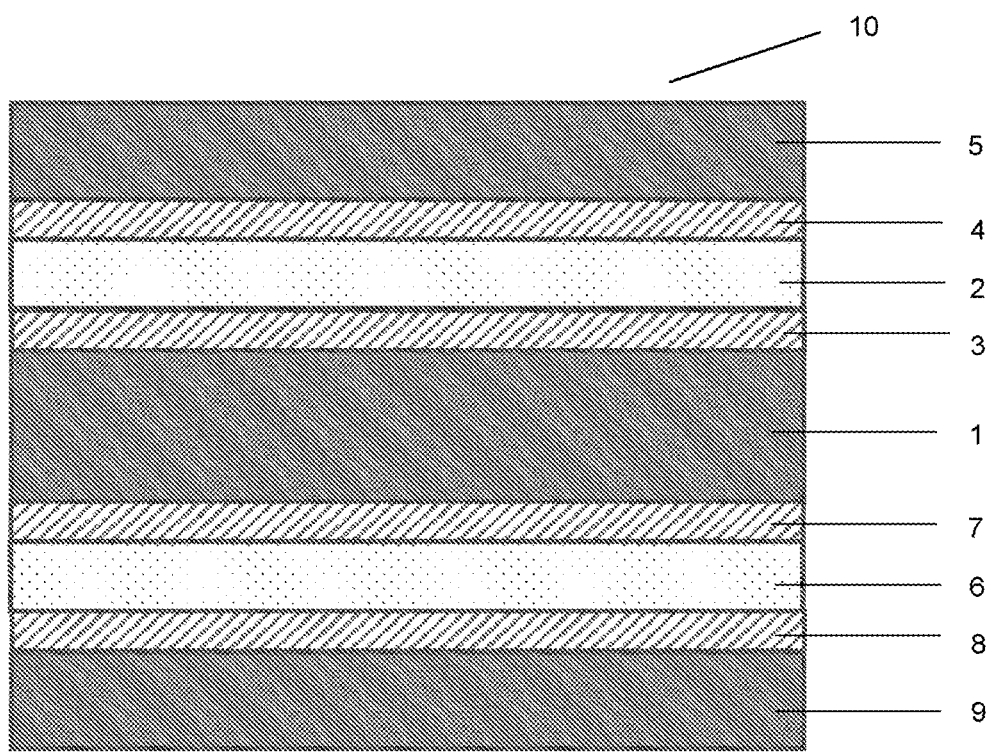

MULTI-LAYER CARD AND FILM ASSEMBLY

CROSS-REFERENCE TO RELATED APPLICATIONS

This application is a U.S. National Stage patent application based on International Application No. PCT/GB2018/051223, filed May 8, 2018, which claims the benefit of United Kingdom Application No. GB 1707355.2, filed May 8, 2017, each of which is hereby incorporated herein by reference in its entirety.

This invention relates to a multi-layer film suitable for use in a multi-layer card such as an identification, credit or magnetic card, and further relates to the multi-layer card itself.

Polyester films, such as polyethylene terephthalate (PET) films, have been widely used in the production of an identification card or magnetic card, such as a credit card, and including pre-paid cards such as travel or telephone cards, and "smart" cards such as cards capable of storing information about financial transactions. Such cards are usually constructed of multiple sheets of the same or different polymeric materials, including polyesters (such as PET), polycarbonate, polyolefin, polyvinyl chloride (PVC), ABS (acrylonitrile butadiene styrene) and paper. The cards are typically opaque and contain at least one opaque layer.

U.S. Pat. Nos. 7,785,680 and 7,232,602 disclose multi-layer cards containing a multi-layer film which comprises a polyester base layer, a copolyester heat-sealable layer disposed on the first side of the base layer, and a printable layer (for instance, an ink-receptive layer) disposed on the second side of the base layer. Preferably, the copolyester of the heat-sealable layer is derived from terephthalic acid, isophthalic acid (IPA) and ethylene glycol (hereinafter referred to as PET-IPA copolyester). The polyester base layer comprises a copolyesterether in order to reduce the tendency of the card to delaminate in use. In conventional cards, the multi-layer film is adhered to one or both sides (typically both sides) of a polymeric core layer (also referred to as an "inlay") via said copolyester heat-sealable layer, i.e. so that the engraveable/printable layer is exposed or outward-facing. The inlay is typically PVC, but may also be, for example, polycarbonate, polyolefin or ABS. However, in order to achieve the required adhesion, it is typically necessary to interpose an additional adhesive between the inlay and the copolyester heat-sealable layer of the multi-layer film, which adds a further level of complexity and cost to the manufacture of the cards. It would be desirable to dispense with this additional adhesive layer.

In the use of the cards described in U.S. Pat. Nos. 7,785,680 and 7,232,602, information is imparted to the printable layer, by a suitable printing technique. Typically, the cards are then generated after printing by punching the card shape from a printed sheet. The cards are finished with a protective cover layer (also referred to as an "overlay") to provide protection, including security, to the printable layer and the information contained thereon. The overlay may also function as an engraveable layer, particularly a laser-engraveable layer, which is capable of carrying additional information. Laser-engraving techniques and equipment are well-known in the art. The overlay is typically PVC, but may also be, for example, polycarbonate, polyolefin or ABS. In order to achieve the required adhesion, it has previously been necessary to interpose an additional adhesive between the overlay and the multi-layer film, and this is usually achieved by virtue of an adhesive coating on one surface of the overlay, which adds a further level of complexity and cost to the manufacture of the cards. It would be preferable to dispense with this additional adhesive layer and enable the use of an uncoated overlay where possible, particularly for cards in which the printed film comprises relatively a low degree of ink coverage. While cards in which the printed film comprises a relatively high degree of ink coverage may nevertheless still require an additional adhesive layer and the use of a coated overlay, it would be desirable to provide a card comprising a multi-layer film which is able to satisfactorily adhere to both uncoated and coated overlays, for instance in order to reduce wastage, to improve economy and efficiency of manufacture, and to improve end-user flexibility.

Furthermore, it has been observed that the quality of the laser-engraved image (and particularly the definition or resolution thereof) is improved by increasing the thickness of the overlay. However, thicker overlays tend to result in cards with inferior delamination resistance. It would be desirable to improve the definition and resolution of the laser-engraved image while maintaining or improving delamination resistance.

In fact, improved delamination resistance of the existing cards is an important objective in itself, regardless of any increase to the thickness of the overlay, because improved delamination resistance leads to improved durability and tamper-resistance of existing cards. Tamper-resistance is an important and desirable security feature for cards.

It is an object of the present invention to address one or more of the afore-mentioned problems. In particular, it is an object of the present invention to improve the delamination resistance of cards comprising a multi-layer film, in particular in order to improve the durability and tamper-resistance of the card, and preferably also to allow a thicker overlay to be used thus improving the quality of the laser-engraved image in the card. It is a further object to increase the increase the strength of the adhesive bond between the inlay and the multi-layer film, and preferably also between the overlay and the multi-layer film. It is a further object to dispense with the additional adhesive layer between the inlay and the multi-layer film, and preferably also dispensing with the additional adhesive layer between the overlay and the multi-layer film. It is a further object to provide a multi-layer film which provides adequate or improved adhesion and delamination resistance to both uncoated and coated overlays.

The present inventors have also observed that, with regard to the delamination resistance of the conventional cards of the sort described above, the plane of failure is typically within the polyester base layer of the multi-layer film(s) present in the card, particularly when the strength of the adhesive bond between the multi-layer film and the inlay and/or overlay(s) is increased as described above. It would be desirable to increase the delamination resistance by reducing or eliminating cohesive failure in the polyester base layer, i.e. by increasing the cohesive strength of the polyester base layer. A further object of the present invention is to improve the delamination resistance of the card while maintaining excellent optical properties such as opacity and whiteness, i.e. without significant detriment to the optical properties of the card.

BRIEF DESCRIPTION OF THE DRAWINGS

FIG. 1 illustrates a multi-layer card according to aspects of the invention.

The present invention addresses one or more of the problems described above.

According to a first aspect of the present invention, there is a multi-layer card comprising a polymeric inlay layer having a first surface and a second surface, further comprising a multi-layer film which is disposed on the first surface of the polymeric inlay layer, and further comprising a first polymeric overlay layer which is disposed on said multi-layer film, such that the layer order is polymeric inlay layer, multi-layer film and first polymeric overlay layer, wherein said multi-layer film comprises:
(i) a polyester base layer (B) comprising a crystallisable polyester ($P_B$), and further comprising titanium dioxide in an amount of from about 1 to about 30 wt % by total weight of the base layer;
(ii) a first heat-sealable copolyester layer (A1) disposed on a first surface of said polyester base layer; and
(iii) optionally a second heat-sealable copolyester layer (A2) disposed on a second surface of said polyester base layer, wherein the copolyester ($CP_A$) of each of the first and optional second heat-sealable copolyester layers is independently selected from amorphous copolyesters ($ACP_A$) derived from an aliphatic diol and a cycloaliphatic diol and at least one aromatic dicarboxylic acid, and/or the polyester base layer (B) further comprises a copolyester ($CP_B$) in an amount of at least about 10% by weight based on the total weight of the base layer (B).

According to a second aspect of the present invention, there is provided a multi-layer card comprising a polymeric inlay layer having a first surface and a second surface, further comprising a multi-layer film which is disposed on the first surface of the polymeric inlay layer, and further comprising a first polymeric overlay layer which is disposed on said multi-layer film, such that the layer order is polymeric inlay layer, multi-layer film and first polymeric overlay layer, wherein said multi-layer film comprises:
(i) a polyester base layer (B) comprising a crystallisable polyester ($P_B$), and further comprising titanium dioxide in an amount of from about 1 to about 30 wt % by total weight of the base layer; and
(ii) a first heat-sealable copolyester layer (A1) disposed on a first surface of said polyester base layer; and
(iii) optionally a second heat-sealable copolyester layer (A2) disposed on a second surface of said polyester base layer, wherein the copolyester ($CP_A$) of each of the first and optional second heat-sealable copolyester layers is independently selected from amorphous copolyesters ($ACP_A$) derived from an aliphatic diol and a cycloaliphatic diol and at least one aromatic dicarboxylic acid,
and preferably wherein the polyester base layer (B) further comprises a copolyester ($CP_B$) in an amount of at least about 10% by weight based on the total weight of the base layer (B).

According to a third aspect of the present invention, there is provided a multi-layer card comprising a polymeric inlay layer having a first surface and a second surface, further comprising a multi-layer film which is disposed on the first surface of the polymeric inlay layer, and further comprising a first polymeric overlay layer which is disposed on said multi-layer film, such that the layer order is polymeric inlay layer, multi-layer film and first polymeric overlay layer, wherein said multi-layer film comprises:
(i) a polyester base layer (B) comprising a crystallisable polyester ($P_B$), and further comprising titanium dioxide in an amount of from about 1 to about 30 wt % by total weight of the base layer; and
(ii) a first heat-sealable copolyester layer (A1) disposed on a first surface of said polyester base layer; and
(iii) optionally a second heat-sealable copolyester layer (A2) disposed on a second surface of said polyester base layer, wherein the polyester base layer (B) further comprises a copolyester ($CP_B$) in an amount of at least about 10% by weight based on the total weight of the base layer (B), and preferably wherein the copolyester ($CP_A$) of each of the first and optional second heat-sealable layers (A1) and (A2) is selected from copolyesters (I-$CP_A$) derived from repeating units consisting of a first aromatic dicarboxylic acid, a second aromatic dicarboxylic acid and an aliphatic glycol.

The present inventors have unexpectedly found that the multi-layer films described herein overcome at least one of the aforementioned problems. In particular, the multi-layer film exhibits superior adhesion to the inlay and/or overlay(s) of a multi-layer card, thereby improving the efficiency and economy of manufacture, and improving the delamination resistance. The multi-layer film described herein further exhibits superior cohesive strength within the polyester base layer, thereby improving delamination resistance. The durability, security resistance and tamper-resistance of the multi-layer card are thereby improved. In addition, superior adhesion to an overlay allows a thicker overlay to be utilised, allowing improvements in the quality of the laser-engraved image. Moreover, the multi-layer film described herein achieves improved delamination resistance while simultaneously exhibiting excellent optical properties.

The multi-layer film is a self-supporting film or sheet by which is meant a film or sheet capable of independent existence in the absence of a supporting base.

The polyester base layer (B) is preferably uniaxially or biaxially oriented, preferably biaxially oriented. As discussed below, orientation is effected by stretching the film in one or two direction(s). The stretching step(s) is/are preferably conducted on the multi-layer film comprising said base layer and said copolyester layer(s). The heat-sealable copolyester layers A1 and A2 are amorphous layers. Amorphous copolyester layers may be achieved by virtue of the intrinsic properties and amorphous nature of the copolyester of the heat-sealable layers A1 and A2, for instance when the copolyester of these layers is derived from an aliphatic diol and a cycloaliphatic diol and at least one aromatic dicarboxylic acid (as described hereinbelow for copolyesters $ACP_A$). Alternatively, an amorphous copolyester layer may be achieved by virtue of a combination of the intrinsic properties of the copolyester of the heat-sealable layers A1 and A2 and the manner in which the film is manufactured, for instance when the copolyester used in layer A1 and/or A2 (as described hereinbelow for copolyesters I-$CP_A$) is not necessarily always amorphous but is rendered amorphous by the temperature profile of the manufacturing process which results in only the base layer (B) becoming oriented in the finished multi-layer film, as is well-known in the art.

The polyesters which make up the multi-layer film are typically synthetic linear polyesters. The polyesters are suitably thermoplastic polyesters. Suitable polyesters are obtainable by condensing one or more dicarboxylic acid(s) or their lower alkyl (up to 6 carbon atoms) diesters with one or more diols. The dicarboxylic acid component contains at least one aromatic dicarboxylic acid, which is preferably terephthalic acid (TA), isophthalic acid (IPA), phthalic acid, 1,4-, 2,5-, 2,6- or 2,7-naphthalenedicarboxylic acid, and is preferably terephthalic acid or 2,6-naphthalenedicarboxylic acid, and preferably terephthalic acid. The polyester may also contain one or more residues derived from other dicarboxylic acids such as 4,4'-diphenyldicarboxylic acid, hexahydro-terephthalic acid, 1,10-decanedicarboxylic acid, and aliphatic dicarboxylic acids including those of the general formula $C_nH_{2n}(COOH)_2$ wherein n is 2 to 8, such as succinic acid, glutaric acid sebacic acid, adipic acid, azelaic acid, suberic acid or pimelic acid. The diols are preferably selected from aliphatic and cycloaliphatic glycols. Preferably, the aliphatic glycol has from 2 to 4 carbon atoms and is suitably a straight chain diol, such as ethylene glycol (EG), 1,3-propanediol or 1,4-butanediol. Preferably the cycloaliphatic glycol contains a single ring, preferably a 6-membered ring, and is preferably 1,4-cyclohexanedimethanol (CHDM). Preferably the glycol is selected from ethylene glycol (EG) and 1,4-cyclohexanedimethanol. Film-forming polyester resin (i.e. the polyesters and/or copolyesters described in more detail below) is the major component of a layer of the multi-layer film, and makes up at least 50% by weight of the total weight of a given layer, preferably at least 65%, typically at least 80%, more typically at least 85% by weight of the total weight of a given layer.

The polyester base layer (B) comprises a crystallisable polyester ($P_B$), preferably derived from the carboxylic acids (preferably the aromatic dicarboxylic acids) and glycols described above. Preferably the crystallisable polyester ($P_B$) contains only one dicarboxylic acid, preferably an aromatic dicarboxylic acid, preferably terephthalic acid or 2,6-naphthalenedicarboxylic acid, and preferably terephthalic acid. Preferably the crystallisable polyester ($P_B$) contains only one glycol, preferably an aliphatic glycol, preferably ethylene glycol. Preferably the crystallisable polyester ($P_B$) contains one aromatic dicarboxylic acid and one aliphatic glycol. Polyethylene terephthalate (PET) or polyethylene 2,6-naphthalate (PEN), particularly PET, is the preferred crystallisable polyester ($P_B$). The crystallisable polyester ($P_B$) may optionally contain relatively minor amounts of one or more residues derived from the other dicarboxylic acids and/or diols described above, and where such minor amounts are present then the total amount of said other dicarboxylic acid(s) is preferably less than 10 mol %, preferably less than 5 mol %, preferably less than 1 mol % of the total dicarboxylic acid fraction of polyester ($P_B$) and/or the total amount of said other diol(s) is preferably less than 15 mol %, preferably less than 10 mol %, preferably less than 5 mol % of the total diol fraction of the polyester ($P_B$). The crystallisable polyester ($P_B$) preferably makes up from about 10% to about 85% by weight of the total weight of the base layer (B), preferably at least about 20%, preferably at least about 30%, preferably at least about 35%, preferably no more than about 80%, preferably no more than about 70%, preferably no more than about 60%, preferably no more than about 50%, preferably no more than about 45%, preferably no more than about 45% by weight of the total weight of the base layer (B).

The intrinsic viscosity of the crystallisable polyester ($P_B$) itself is preferably at least about 0.60, typically no more than 0.70, typically no more than 0.65.

The base layer (B) preferably further comprises a copolyester ($CP_B$; referred to herein as "the base layer copolyester"), which is preferably added as a blend with the crystallisable polyester ($P_B$) in the base layer (B). The present inventors have surprisingly found that the addition of copolyester $CP_B$ improves the delamination resistance of the multi-layer film and card and increases the cohesive strength of the base layer (B), i.e. reduces or eliminates cohesive failure in the base layer (B). This copolyester $CP_B$ is preferably present in the base layer (B) such that copolyester $CP_B$ is present in amounts of no more than about 75%, preferably no more than about 60%, preferably no more than about 50%, preferably no more than about 45%, at least about 10%, preferably at least about 20%, preferably at least about 30%, preferably at least about 35% by weight, based on the total weight of the base layer (B). The copolyester $CP_B$ is derived from repeating units consisting of one or more aromatic dicarboxylic acid(s) and one or more diols selected from aliphatic diols and cycloaliphatic diols, and optionally one or more aliphatic dicarboxylic acid(s), and is preferably derived from repeating units consisting of one or more aromatic dicarboxylic acid(s) and one or more diols selected from aliphatic diols and cycloaliphatic diols, and preferably from the acids and glycols described hereinabove. Thus, the aliphatic glycol is suitably a straight-chain $C_{2-4}$ diol, and the cycloaliphatic glycol suitable contains a single 6-membered ring. The copolyester $CP_B$ is preferably selected from (i) copolyesters derived from repeating units consisting of a first aromatic dicarboxylic acid, a second aromatic dicarboxylic acid and an aliphatic glycol; and (ii) copolyesters derived from repeating units consisting of an aromatic dicarboxylic acid, an aliphatic glycol and a cycloaliphatic glycol; and is preferably selected from copolyesters derived from repeating units consisting of a first aromatic dicarboxylic acid, a second aromatic dicarboxylic acid and an aliphatic glycol. The copolyester $CP_B$ is preferably selected from (i) a copolyester derived from repeating units consisting of TA, IPA and EG; and (ii) a copolyester derived from repeating units consisting of TA, EG and CHDM; and is preferably selected from a copolyester derived from repeating units consisting of TA, IPA and EG. More than one type of such copolyester $CP_B$ may be present in the base layer, but preferably no more than two types of such copolyesters $CP_B$ may be present in the base layer, and copolyesters of type (i) and type (ii) may both be present in the base layer. Where the copolyester is derived from repeating units consisting of a first aromatic dicarboxylic acid (preferably TA), a second aromatic dicarboxylic acid (preferably IPA), and an aliphatic glycol (preferably EG), the second aromatic dicarboxylic acid is preferably present in an amount of from about 5 to about 30 mol %, preferably from about 10 to about 25 mol %, preferably from about 10 to about 20 mol %, and in one preferred embodiment from about 15 to about 20 mol % or in another preferred embodiment from about 10 to about 15 mol % of the acid fraction of the copolyester. Where the copolyester $CP_B$ is derived from repeating units consisting of TA, EG and CHDM, the copolyester is preferably selected from those described below for the first and second heat-sealable layers (A1) and (A2) (referred to as copolyesters $ACP_A$), and may be the same as or different to said copolyester(s) of the first and second heat-sealable layers (A1) and (A2) but is preferably the same. It will be appreciated that the copolyester $CP_B$ does not contain polyether segments, i.e. it is not a copolyesterether.

Where the copolyester $CP_B$ is a copolyester derived from repeating units consisting of a first aromatic dicarboxylic acid, a second aromatic dicarboxylic acid and an aliphatic glycol, and preferably from TA, IPA and EG, the total amount of said second aromatic dicarboxylic acid (preferably IPA) in the polyester base layer is preferably from about 3 to about 15 wt %, preferably from about 5 to about 10 wt %, preferably from about 7 to about 9 wt %, by total weight of the base layer.

The intrinsic viscosity of the copolyester $CP_B$ itself is preferably at least about 0.65, preferably no more than 0.70.

The copolyester $CP_B$ preferably has a lower melting point than said crystallisable polyester $P_B$, preferably wherein the melting point of copolyester $CP_B$ has a melting point which is at least about 10° C., preferably at least about 25° C., preferably at least about 40° C. lower than the melting point of said crystallisable polyester $P_B$, and preferably no more than about 60° C., preferably no more than about 50° C. lower than the melting point of said crystallisable polyester $P_B$, particularly when the copolyester $CP_B$ is derived from repeating units consisting of a first aromatic dicarboxylic acid, a second aromatic dicarboxylic acid and an aliphatic glycol.

The base layer (B) preferably comprises a copolyesterether. The copolyesterether is preferably a block copolymer. The block copolyesterether predominantly comprises at least one polyester block (referred to herein as a "hard" segment), and at least one polyether block (referred to herein as a "soft" segment), as described in U.S. Pat. No. 7,232, 602. The ratio of hard:soft block in the copolyesterether is preferably in the range from 10-95:5-90, more preferably 25-55:45-75, and particularly 35-45:55-65 hard:soft, by weight % of the copolyesterether.

The hard polyester block of the copolyesterether is suitably formed by condensing one or more dicarboxylic acids, or ester derivatives or ester forming derivatives thereof, with one or more glycols. The dicarboxylic acid or derivative thereof may be aliphatic, cycloaliphatic or aromatic. Suitable aliphatic or cycloaliphatic dicarboxylic acids include 1,3- or 1,4-cyclohexane dicarboxylic, adipic, glutaric, succinic, carbonic, oxalic and azelaic acids. Aromatic dicarboxylic acids are preferred and include terephthalic, isophthalic, phthalic, bibenzoic and naphthalenedicarboxylic acids, and the dimethyl derivatives thereof. The glycol component may also be aliphatic, cycloaliphatic or aromatic. The glycol is preferably aliphatic or cycloaliphatic. Suitable glycols include ethylene glycol, 1,3-propanediol, 1,4-butanediol, neopentyl glycol, 1,6-hexanediol and 1,4-cyclohexane dimethanol. Terephthalic acid is a preferred aromatic dicarboxylic acid. Butylene glycol is a preferred glycol. The polyester block suitably predominantly comprises (and preferably consists of) at least one alkylene terephthalate, for example ethylene terephthalate, butylene terephthalate and/or hexylene terephthalate. Butylene terephthalate is particularly preferred. The molecular weight ($M_W$) of the polyester block is preferably less than 15,000, more preferably in the range from 440 to 10,000, particularly 660 to 3000, and especially 880 to 1500. Molecular weight determination may be conducted on a Hewlett-Packard 1050 Series HPLC system equipped with two GPC Ultrastyragel columns, $10^3$ and $10^4$ Å (5 μm mixed, 300 mm×19 mm, Waters Millipore Corporation, Milford, Mass., USA) and THF as mobile phase. The molecular weight is calculated by comparison with the retention times of polystyrene standards.

The soft polyether block of the copolyesterether is a polymeric glycol suitably formed from one or more glycols such as ethylene glycol, 1,2- or 1,3-propanediol, 1,4-butanediol, neopentyl glycol, 1,6-hexanediol and 1,4-cyclohexane dimethanol. The polyether block is preferably a poly(alkylene oxide) glycol, for example poly(ethylene oxide) glycol, poly(1,2- and 1,3-propylene oxide) glycol, poly (tetramethylene oxide) glycol, and random or block copolymers of ethylene oxide and propylene oxide. Poly(tetramethylene oxide) glycol is a preferred component of the polyether block. The molecular weight ($M_W$; measured as noted above) of the polyether block (preferably poly(tetramethylene oxide) glycol) is preferably in the range from 350 to 10,000, more preferably 600 to 5000, particularly 900 to 2000, and especially 1200 to 1800. In a particularly preferred embodiment, the copolyesterether comprises as the polyether block, a mixture of poly(tetramethylene oxide) glycol and poly(propylene oxide) glycol, suitably in a ratio of from 1 to 20:1, preferably 5 to 15:1, and more preferably 8 to 12:1. The molecular weight ($M_W$; measured as described above) of the poly(propylene oxide) glycol is preferably in the range from 1000 to 5000, more preferably 2000 to 3000.

The copolyesterethers can be prepared by conventional polymerisation techniques. The copolyesterether is preferably dried prior to film formation and/or prior to incorporation in the composition of the base layer (B). The copolyesterether may be dried in isolation, or after mixing with one or more of the other components of the base layer, e.g. dried after mixing with any opacifying agent present in the base layer (which is discussed hereinbelow). The copolyesterether may be dried by conventional means, for example in a fluidised bed, or in an oven, at elevated temperature, under vacuum or by passing through an inert gas, e.g. nitrogen. The water content of the copolyesterether prior to extrusion of the film-forming base layer composition is preferably in the range from about 0 to about 800 ppm, preferably from about 25 to about 600 ppm, more preferably from about 50 to about 400 ppm, particularly from about 100 to about 300 ppm, and especially from about 150 to about 250 ppm.

The amount of copolyesterether present in the base layer (B) is preferably in the range from 0.2 to 30, preferably from 1 to 20, preferably from 1 to 15, preferably from 1 to 12, preferably from 1 to 10, preferably at least 3, particularly at least 5, and preferably at least 6% by weight, relative to the total weight of the base layer (B).

The copolyesterether preferably has a flexural modulus (measured at 23° C. according to ASTM D790) of 200 MPa or less, and more preferably in the range from 50 to 100 MPa. In addition, preferred copolyesterethers have a Shore hardness (measured at 23° C. on the D scale according to DIN 53505) of 60 or less, particularly in the range from 35 to 45.

In the second aspect of the invention, and optionally in the first and third aspects of the invention, each of the first and second heat-sealable layers (A1) and (A2) comprises an amorphous copolyester ($ACP_A$) which is independently selected from amorphous copolyesters derived from an aliphatic diol and a cycloaliphatic diol and at least one aromatic dicarboxylic acid, and preferably from the aromatic dicarboxylic acids and diols described above. Preferably the amorphous copolyester $ACP_A$ contains only one aromatic dicarboxylic acid, preferably terephthalic acid. Preferred aliphatic glycols are ethylene glycol and butane diol, more preferably ethylene glycol. Preferably the amorphous copolyester $ACP_A$ contains only one aliphatic glycol, preferably ethylene glycol. A preferred cycloaliphatic glycol is 1,4-cyclohexanedimethanol. Preferably the amorphous copolyester $ACP_A$ contains only one cycloaliphatic diol, preferably 1,4-cyclohexanedimethanol. A preferred amorphous copolyester $ACP_A$ is derived from terephthalic acid, ethylene glycol and 1,4-cyclohexanedimethanol. The preferred molar ratios of the cycloaliphatic diol to the aliphatic diol are in the range from 10:90 to 70:30, preferably 10:90 to 60:40, preferably in the range from 20:80 to 40:60, and more preferably from 30:70 to 35:65. Thus, it is preferred that the glycol fraction of the amorphous copolyester $ACP_A$ comprises from 10 to 70 mol %, preferably 10 to 60 mol %, preferably 20 to 40 mol %, preferably 30 to 35 mol % cycloaliphatic diol and from 30 to 90 mol %, preferably 40 to 90 mol %, preferably 60 to 80 mol %, preferably 65 to 70 mol % aliphatic diol. In a preferred embodiment this copolyester is a copolyester of terephthalic acid wherein the glycol fraction comprises about 33 mol % 1,4-cyclohexanedimethanol and about 67 mol % ethylene glycol. An example of such a polymer is Skygreen™ S2008 or PN100 (SK Chemicals) or PETG™6763 (Eastman) which comprises a copolyester of terephthalic acid and a glycol fraction comprising about 33% 1,4-cyclohexane dimethanol and about 67% ethylene glycol and which is always amorphous. The copolyester may optionally contain relatively minor amounts of one or more residues derived from the other dicarboxylic acids and/or diols described above, and where such minor amounts are present then the total amount of said other dicarboxylic acid(s) is preferably less than 10 mol %, preferably less than 5 mol %, preferably less than 1 mol % of the total dicarboxylic acid fraction of the copolyester and/or the total amount of said other diol(s) is preferably less than 10 mol %, preferably less than 5 mol %, preferably less than 1 mol % of the total diol fraction of the copolyester. The copolyester of the first heat-sealable layer (A1) may be the same as or different to the copolyester of the second heat-sealable layer (A2) but preferably the same copolyester is used for the first and second heat-sealable layers (A1) and (A2). A symmetrical layer structure is preferred. Where the base layer (B) comprises copolyester $CP_B$ (as defined hereinabove), the copolyester $CP_B$ may be an amorphous copolyester which is the same as or different to (and is preferably different to) the amorphous copolyester $ACP_A$ of one or both (and preferably both) of the first and second heat-sealable layers (A1) and (A2).

The intrinsic viscosity (IV) of the amorphous copolyester $ACP_A$ from which each of heat-sealable layers (A1) and (A2) is manufactured is preferably at least about 0.65, preferably at least about 0.68, preferably at least about 0.70, and preferably no more than about 0.85, preferably no more than about 0.80. If the IV is too high, this may give rise to poor film profile and difficulties in processing and manufacturing the film.

Each of the heat-sealable layers (A1) and (A2) may, independently, comprise a blend of two or more of said amorphous copolyesters $ACP_A$ (and typically a blend of only two of said copolyesters) wherein each of said amorphous copolyesters is preferably derived from the carboxylic acids and glycols described hereinabove. The amorphous copolyesters in a blend may be derived from the same carboxylic acids and glycols, optionally with the same molar ratios of comonomers, such that the copolyesters differ in their IV. Thus, each of the heat-sealable layers (A1) and (A2) may, independently, comprise a first amorphous copolyester $ACP_A$ comprising a first aromatic dicarboxylic acid and first and second glycols, for instance TA/EG/CHDM, and a second amorphous copolyester $ACP_A$ comprising the same monomer units, wherein the first copolyester has a relatively high IV and the second copolyester has a relatively low IV. Where a blend of amorphous copolyesters $ACP_A$ are used, it is preferred that the same blend is used in the first and second heat-sealable layers (A1) and (A2).

In the preferred embodiment of the third aspect of the invention, and optionally in the first aspect of the invention where the polyester base layer (B) comprises at least about 10% w/w of a copolyester ($CP_B$), the copolyester ($CP_A$) of each of the first and second heat-sealable layers (A1) and (A2) is selected from copolyesters (referred to herein as I-$CP_A$) derived from repeating units consisting of a first aromatic dicarboxylic acid, a second aromatic dicarboxylic acid and an aliphatic glycol, preferably wherein said first aromatic dicarboxylic acid, said second aromatic dicarboxylic acid and said aliphatic glycol are selected from the acids and glycols described hereinabove, preferably wherein said first aromatic dicarboxylic acid is TA and said second aromatic dicarboxylic acid is IPA, and said aliphatic glycol is EG, preferably wherein the second aromatic dicarboxylic acid is present in an amount of from about 5 to about 30 mol %, preferably from about 10 to about 25 mol %, preferably from about 10 to about 20 mol %, and preferably from about 15 to about 20 mol % of the acid fraction of the copolyester. It will be appreciated that the copolyester I-$CP_A$ does not contain polyether segments, i.e. it is not a copolyesterether. The intrinsic viscosity of the copolyester I-$CP_A$ itself is preferably at least about 0.65, preferably no more than 0.70. The copolyester I-$CP_A$ has a lower melting point than said crystallisable polyester $P_B$, preferably wherein the melting point of copolyester I-$CP_A$ has a melting point which is at least about 10° C., preferably at least about 25° C., preferably at least about 40° C. lower than the melting point of said crystallisable polyester $P_B$, and preferably no more than about 60° C., preferably no more than about 50° C. lower than the melting point of said crystallisable polyester $P_B$. The copolyester I-$CP_A$ may be the same as or different to the copolyester $CP_B$ and is preferably the same.

According to a fourth aspect of the present invention, there is provided a multi-layer card comprising a polymeric inlay layer having a first surface and a second surface, further comprising a multi-layer film which is disposed on the first surface of the polymeric inlay layer, and further comprising a first polymeric overlay layer which is disposed on said multi-layer film, such that the layer order is polymeric inlay layer, multi-layer film and first polymeric overlay layer, wherein said multi-layer film comprises:

(i) a polyester base layer (B) comprising a crystallisable polyester ($P_B$), and further comprising titanium dioxide in an amount of from about 1 to about 30 wt % by total weight of the base layer; and (ii) a first heat-sealable copolyester layer (A1) disposed on a first surface of said polyester base layer; and (iii) optionally a second heat-sealable copolyester layer (A2) disposed on a second surface of said polyester base layer, wherein the copolyester ($CP_A$) of each of the first and optional second heat-sealable copolyester layers is independently selected from said copolyesters I-$CP_A$; and wherein the multi-layer film is obtained by a process comprising heat-setting at a temperature of greater than 225° C. and preferably in the range of 227 to 235° C.

The copolyester ($CP_A$) of each of the heat-sealable layers (A1) or (A2) is the major component of the layer, and makes up at least 50% by weight of the total weight of the layer, preferably at least 65%, preferably at least 80%, preferably at least 90%, more typically at least 95% by weight of the total weight of the layer.

It is preferred that the multi-layer film comprises a first heat-sealable copolyester layer (A1) disposed on a first surface of said polyester base layer, and a second heat-sealable copolyester layer (A2) disposed on a second surface of said polyester base layer. This is particularly so in respect of the first, second and third aspects of the invention, and particularly wherein the heat-sealable copolyester ($CP_A$) is selected from amorphous copolyesters ($ACP_A$) derived from an aliphatic diol and a cycloaliphatic diol and at least one aromatic dicarboxylic acid.

In alternative embodiments, the optional second heat-sealable copolyester layer (A2) on the second surface of the polyester base layer is not present, and in these embodiments an acrylic ink-receptive layer is suitably disposed on the second surface of the polyester base layer. In such embodiments, it is the second surface of the polyester base layer which is disposed towards the polymeric overlay layer in the multi-layer cards described hereinbelow, and it is the first surface of the polyester layer and the first heat-sealable layer (A1) which is disposed towards the polymeric inlay layer in the multi-layer cards described hereinbelow. In these embodiments, it will be appreciated that the card suitably comprises adhesive-coated polymeric overlay layers. The acrylic ink-receptive comprises an acrylic resin, by which is meant a resin which comprises at least one acrylic and/or methacrylic component. Suitable acrylic layers and resins are disclosed in U.S. Pat. No. 7,785,680, the disclosure of which is incorporated herein by reference. A preferred acrylic resin is derived from three monomers and comprises 35 to 60 mole % of ethyl acrylate, 30 to 55 mole % of methyl methacrylate and 2 to 20 mole % of acrylamide or methacrylamide, and preferably comprises approximate molar proportions 46/46/8% respectively of ethyl acrylate/methyl methacrylate/acrylamide or methacrylamide; preferably wherein the polymer is thermoset, for example in the presence of a suitable cross-linker, preferably a methylated melamine-formaldehyde resin, preferably in an amount of about 25 wt % of the acrylic resin monomers.

Formation of the polyesters described hereinabove is conveniently effected in a known manner by condensation or ester interchange, generally at temperatures up to about 295° C. In a preferred embodiment, solid state polymerisation may be used to increase the intrinsic viscosity of crystallisable polyesters to the desired value, using conventional techniques well-known in the art, for instance using a fluidised bed such as a nitrogen fluidised bed or a vacuum fluidised bed using a rotary vacuum drier. In the following description of polymer and film manufacture, it will be understood that the term "polyester" includes "copolyester".

Formation of the multi-layer polyester film described herein may be effected by conventional techniques, including co-extrusion, lamination and coating techniques well-known in the art, and most preferably by co-extrusion. In general terms, the co-extrusion process comprises the steps of co-extruding the respective polyester compositions through independent orifices of a multi-orifice die, and thereafter uniting the still molten layers or, preferably, by single-channel co-extrusion in which molten streams of the respective polyesters are first united within a channel leading to a die manifold, and thereafter extruded together from the die orifice under conditions of streamline flow without intermixing thereby to produce a laminated film. Thus, the multi-layer film is preferably a co-extruded multi-layer film, i.e. the polyester base layer (B) and the heat-sealable copolyester layers (A1) and (A2) are co-extruded. The extrusion is generally carried out at a temperature within the range of from about 250 to about 300° C., and is followed by quenching the extrudate and orienting the quenched extrudate. Preferably the amorphous copolyester which forms the heat-sealable layers (A1) and (A2) is extruded at a temperature which is lower than that used for the extrusion of the polyester which forms the base layer (B). Preferably the amorphous copolyester is extruded at a temperature from about 250 to about 290° C., and preferably no higher than about 280° C. and preferably from about 265 to about 275° C. Preferably the polyester which forms the base layer (B) is extruded at a temperature from about 270 to about 300° C., preferably from about 260 to about 280° C.

Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable, preferably at least about 200° C., preferably at least about 210° C., preferably at least about 215° C., preferably at least about 220° C., and preferably greater than 225° C., and preferably no more than about 235° C. In a preferred embodiment, the heat-set-temperature is within the range of from about 227° C. to about 235° C., preferably from about 228 to about 232° C. Surprisingly, the inventors found that higher heat-set temperatures improved the delamination performance. After heat-setting the film is typically quenched rapidly in order induce the desired crystallinity of the polyester.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The multi-layer film (and preferably the base layer (B)) is preferably opaque, by which is meant substantially impermeable to light, and preferably exhibits a Transmission Optical Density (TOD) of at least 0.3, preferably at least 0.4, preferably at least 0.5, preferably at least 0.6, preferably at least 0.8, preferably at least 1.0, and preferably in the range from 0.6 to 2.0, more preferably 0.8 to 2.0, particularly 1.0 to 2.0. It will be appreciated that optical density varies with thickness. A film having a thickness of 150 μm or greater preferably exhibits an optical density of at least 1.0 and a film having a thickness of 250 μm or more preferably exhibits an optical density of at least 1.7.

The multi-layer film (and preferably the base layer (B)) is preferably white and suitably exhibits a whiteness index, measured as herein described, of at least 60, preferably at least 85, preferably at least 90, preferably at least 92, preferably at least 94, typically no more than about 120, more preferably in a range from 90 to 105, particularly 95 to 105, and especially 97 to 103 units.

The multi-layer film (and preferably the base layer (B)) preferably has the following CIE laboratory colour co-ordinate values for L*, a* and b*, measured as herein described. The L* value is suitably greater than 85.00, preferably greater than 90.00, preferably greater than 92.00, preferably greater than 93.00, and typically in the range from 90.00 to 100.00, more typically from 92.00 to 99.00, preferably from 92.00 to 97.00, more preferably from 92.00 to 95.00. The a* value is preferably in the range from −2.00 to −0.50, preferably from −1.60 to −0.50. The b* value is preferably in the range from −4.00 to −1.00.

The multi-layer film (and preferably the base layer (B)) preferably exhibits a yellowness index, measured as herein described, of less than or equal to 3, more preferably in the range from −10 to 0, particularly −8 to −3, and especially −7 to −5.

The multi-layer film is conveniently rendered opaque by incorporating an opacifying agent into one or more layers of the multi-layer film, and specifically into the polyester base layer (B). The first and second heat-sealable layers (A1) and (A2) are typically not opaque; they typically do not contain opacifying agent in an amount effective to impart opacity. The opacifying agent is preferably selected from particulate inorganic fillers. Preferably the opacifying agent also functions as a whitening agent.

Particulate inorganic fillers suitable for generating an opaque polyester layer include conventional inorganic pigments and fillers, and particularly metal or metalloid oxides, such as alumina, titania, talc and silica (especially precipitated or diatomaceous silica and silica gels), calcined china clay, and alkaline metal salts (such as the carbonates and sulphates of calcium and barium). The particulate inorganic filler is preferably of the non-voiding type. Suitable particulate inorganic fillers may be homogeneous and consist essentially of a single filler material or compound, such as titanium dioxide alone. Alternatively, at least a proportion of the filler may be heterogeneous, the primary filler material being associated with an additional modifying component. For example, the primary filler particle may be treated with a surface modifier, such as a pigment, soap, surfactant coupling agent or other modifier to promote or alter the degree to which the filler is compatible with the polyester of the layer.

Preferably, an opaque polyester layer has a degree of voiding in the range from 0 to 15, more preferably 0.01 to 10, particularly 0.05 to 5, and especially 0.1 to 1% by volume. Thus, an opaque polyester layer is preferably substantially free of voids. In other words, a non-voiding opacifying agent is preferred. The degree of voiding can be determined, for example, by sectioning the film using scanning electron microscopy, and measuring the voids by image analysis.

The density of the polyester base layer (B) is preferably in the range from 1.2 to 1.5, more preferably 1.3 to 1.45, and particularly 1.35 to 1.4.

The individual or primary inorganic filler particles suitably have a volume-distributed median particle diameter (as defined below) in the range from 0.05 to 0.40 μm, preferably from 0.10 to 0.25 μm, preferably from 0.15 to 0.25 μm. Typically, the primary inorganic filler particles aggregate to form clusters or agglomerates comprising a plurality of inorganic filler particles. The aggregation process of the primary inorganic filler particles may take place during the actual synthesis of the filler and/or during the polyester and film making process. The aggregated inorganic filler particles preferably have a volume-distributed median particle diameter (equivalent spherical diameter corresponding to 50% of the volume of all the particles, read on the cumulative distribution curve relating volume % to the diameter of the particles, which is often referred to as the "D(v,0.5)" value), as determined by laser diffraction, in the range from 0.3 to 1.5 μm, more preferably 0.4 to 1.2 μm, and particularly 0.5 to 0.9 μm. Preferably at least 90%, more preferably at least 95% by volume of the inorganic filler particles are within the range of the volume-distributed median particle diameter ±0.8 μm, and particularly ±0.5 μm, and particularly ±0.3 μm. Particle size of the filler particles may be measured by electron microscope, coulter counter, sedimentation analysis and static or dynamic light scattering. Techniques based on laser light diffraction (Fraunhofer diffraction) are preferred. A particularly preferred method utilises a Mastersizer (e.g. a 3000) available from Malvern. The median particle size may be determined by plotting a cumulative distribution curve representing the percentage of particle volume below chosen particle sizes and measuring the 50th percentile.

The amount of particulate inorganic filler incorporated into a polyester layer (preferably the base layer (B)) is preferably in the range from about 5 to about 25, preferably from about 8 to about 20, preferably from about 10 to about 18, and preferably from about 10 to about 15% by weight, relative to the total weight of the polyester layer.

The present inventors have observed that rutile titanium dioxide is a surprisingly advantageous opacifying agent, in that it provides surprisingly good properties, namely superior delamination resistance, improvement of the cohesive strength of the polyester base layer, and hence superior tamper-resistance.

Preferably, the titanium dioxide particles (particularly rutile titanium dioxide particles) are coated with an organic coating.

The organic coating is preferably coated uniformly on said titanium dioxide particles. The organic coating is preferably coated discretely on said titanium dioxide particles. The organic material which coats the titanium dioxide particles is thus suitably a film-forming organic material.

Preferably, the organic coating does not comprise or is not derived from a silane.

The organic coating is not, and preferably does not comprise, a polysiloxane.

In a first preferred embodiment (referred to herein as Embodiment A), the organic coating is an organophosphorus compound.

Preferably, the titanium dioxide particles are coated with an alkylphosphonic acid or an ester of an alkylphosphonic acid wherein the alkylphosphonic acid contains from 6 to 22 carbon atoms.

The alkylphosphonic acid or ester thereof is preferably represented by the formula $P(R)(=O)(OR^1)(OR^2)$, wherein: R is an alkyl group or a cycloalkyl group containing 6 to 22 carbon atoms; and
$R^1$ and $R^2$ are each hydrogen, an alkyl group, a cycloalkyl group, an aryl group or an aralkyl group.

When $R^1$ and $R^2$ are both hydrogen, the compound is an alkylphosphonic acid. When at least one of $R^1$ and $R^2$ is a hydrocarbyl group the formula represents an ester of an alkylphosphonic acid.

Preferably, R contains from 6 to 14 carbon atoms.

Preferably, R is a straight chain alkyl group. However, branched chain alkylphosphonic acids and their esters are also suitable.

In the case of the esters, $R^1$ and $R^2$ are preferably independently selected from an alkyl group, a cycloalkyl group, an aryl group or an aralkyl group containing up to 10 carbon atoms and more preferably up to 8 carbon atoms (i.e. the ester is an ester of an alcohol containing up to 10, and preferably up to 8 carbon atoms). $R^1$ and $R^2$ are preferably hydrocarbyl groups. Where $R^1$ and $R^2$ is aryl or aralkyl, the aryl group is preferably phenyl.

$R^1$ and $R^2$ can be different but are typically the same. Preferably $R^1$ and $R^2$ are hydrogen.

Particularly suitable esters include ethyl esters, butyl esters, octyl esters, cyclohexyl esters and phenyl esters.

Particularly preferred phosphorus compounds include n-octylphosphonic acid and its esters, n-decylphosphonic acid and its esters, 2-ethylhexylphosphonic acid and its esters and camphyl phosphonic acid and its esters.

Coated particles according to Embodiment A may be prepared using the processes taught in EP-0707051-A, the process of manufacture of which is incorporated herein by reference.

In a further preferred embodiment (referred to herein as Embodiment B), the organic coating is a polymeric organic coating.

The polymeric backbone of a polymeric organic coating preferably does not contain silicon atoms.

A polymeric organic coating is preferably derived from monomers containing carbon, hydrogen and oxygen atoms, and optionally further comprising nitrogen and/or phosphorus and/or sulphur atoms. Thus, it will be appreciated that the polymeric organic coating is preferably derived from monomers which do not contain silicon atoms.

The coated titanium dioxide particles coated by a polymeric organic coating are preferably obtained by dispersing titanium dioxide particles in water at a pH value higher than the isoelectric point of said titanium dioxide particles (and preferably at a pH above 7 and preferably at a pH of 9 to 11) in the presence of a dispersing agent comprising a polymeric polybasic acid or a salt thereof to produce particles having a modified isoelectric point; adjusting the pH of the dispersion to a value below 9 but above the modified isoelectric point of the particles; and polymerising in the presence of the dispersion so produced one or more ethylenically unsaturated monomer(s) so that said titanium dioxide particles are coated with polymerised monomer. Preferably the particles are manufactured in accordance with the disclosure of EP-0572128-A, the disclosure of which is incorporated herein, and particularly the disclosure of the process of manufacture of the coated particles is incorporated herein.

Without being bound by theory, it is believed that the coated titanium dioxide particles comprise a coherent inner coating formed from the dispersing agent and an outer coating formed from the polymerisation of one or more ethylenically unsaturated monomer(s) and/or the dispersing agent is incorporated into the polymeric coating during polymerisation of the ethylenically unsaturated monomer(s).

The polymeric polybasic acids are preferably selected from polysulphonic acids, polyphosphonic acids and polycarboxylic acids, and preferably from polycarboxylic acids, or salts thereof. When the polymeric polybasic acids are in salt form, the acids may be partially or fully neutralised. Suitable salts are the alkali metal salts or ammonium salts.

Suitable polysulphonic acids are preferably selected from lignosulphonates, petroleum sulphonates and poly(styrene sulphonates), including poly(sodium 4-styrene sulphonate).

Suitable polycarboxylic acids are preferably selected from polymaleic acids, polyacrylic acids, substituted acrylic acid polymers, acrylic copolymers, including copolymers of an acrylic acid with sulphonic acid derivatives, including 2-acrylamido and 2-methyl propane sulphonic acid. Other comonomers polymerisable with the acrylic acid or the substituted acrylic acid may contain a carboxyl group.

Preferably, the dispersing agents exhibit a molecular weight ($M_w$; measured as described hereinabove) of from about 1,000 to about 10,000. Preferably, the dispersing agents are substantially linear molecules.

Preferably, the amount of dispersing agent is from about 0.05 to about 5.0 wt %, preferably from about 0.1 to about 1.0 wt %, by weight of the titanium dioxide particle, i.e. the core, uncoated titanium dioxide particle prior to treatment with the dispersing agent and polymerisable coating monomer(s).

Preferably the polymeric organic coating comprises a polymer derived from one or more ethylenically unsaturated monomer(s). In other words, the polymeric organic coating comprises a polymer derived from the polymerisation of one or more ethylenically unsaturated monomer(s).

The ethylenically unsaturated monomer(s) are preferably polymerisable in aqueous solvents, preferably wherein the polymer produced is insoluble in water and optionally cross-linked by a cross-linking agent.

The ethylenically unsaturated monomer(s) are preferably selected from aliphatic and aromatic compounds containing a polymerisable unsaturated group, preferably wherein the polymerisable unsaturated group is selected from unsaturated carboxylic acids and unsaturated carboxylic acid esters.

The ethylenically unsaturated monomer(s) are preferably acidic monomers selected from acrylic acid, methacrylic acid, itaconic acid, maleic acid or its anhydride, fumaric acid and crotonic acid, and esters of said acidic monomers, including methyl acrylate, ethyl acrylate, methyl methacrylate, butyl acrylate and ethyl methacrylate. The ethylenically unsaturated monomer may also be selected from styrene, vinyl toluene, alpha methylstyrene, ethylene, vinyl acetate, vinyl chloride, acrylonitrile, and fluorinated monomers including fluorinated alkenes, fluorinated ethers, fluorinated acrylic and methacrylic acids and esters thereof and fluorinated heterocyclic compounds. Preferably, the ethylenically unsaturated monomer(s) are selected from unsaturated carboxylic acids and unsaturated carboxylic acid esters, preferably from methyl acrylate, ethyl acrylate, butyl acrylate, butyl methacrylate, vinyl acetate and vinyl isobutylether.

The polymeric organic coating may be cross-linked, preferably by virtue of the presence of one or more cross-linking agent(s), preferably wherein the cross-linking agent is selected from di- and poly-functional ethylenically unsaturated monomers, preferably from ethylene glycol dimethacrylate, ethylene glycol diacrylate, allyl methacrylate, allyl acrylate, 1,3-butanediol diacrylate, divinyl benzene and 1,3-butanediol dimethacrylate, preferably wherein said cross-linking agent in an amount of from about 1 wt % to about 20 wt %, preferably from about 1 wt % to about 10 wt %, based on the total weight of the ethylenically unsaturated monomer(s)

Preferably, the organic coating is selected from the organic coating described hereinabove for Embodiment A.

The organic coating is preferably present in an amount of from about 0.1 to about 200 wt %, preferably from about 0.1 to about 100 wt %, from about 0.5 to about 100 wt %, from about 2.0 to about 20 wt %, by weight of the titanium dioxide. Preferably, the volume ratio of the titanium dioxide particle particles to the organic coating is from 1:1 to 1:25 by volume, and preferably from 1:2 to 1:8.

The titanium dioxide preferably has a water content such that it exhibits a loss at 290° C. of no greater than 1.0%, preferably no greater than 0.5%.

The polymeric organic coated titanium dioxide is preferably not hydrophobic. Preferably the polymeric organic coated titanium dioxide coating is hydrophilic The titanium dioxide particles preferably carry an inorganic coating, typically a metal oxide, preferably selected from aluminium, silicon, zirconium and magnesium oxides, and preferably an alumina, zirconia and/or silica coating, preferably an alumina and/or silica coating or an alumina and/or zirconia coating, preferably an alumina coating. Where the titanium dioxide particles carry an organic coating in addition to an inorganic coating, the organic coating is applied subsequently to the application of the inorganic coating onto the underlying titanium dioxide core.

The multi-layer film optionally comprises an optical brightener, which is typically incorporated into the base layer (B). The optical brightener is preferably present in amounts in the range from 50 to 1500 ppm, more preferably 200 to 1000 ppm, and especially 400 to 600 ppm by weight, relative to the weight of the polyester of the layer. Suitable optical brighteners include those available commercially under the trade names "Uvitex" MES, "Uvitex" OB, "Leucopur" EGM and "Eastobrite" OB-1.

The multi-layer film optionally comprises a blue dye, which is typically incorporated into the base layer (B). The blue dye is preferably present in amounts in the range from 100 to 3000 ppm, more preferably 200 to 2000 ppm, and especially 300 to 1000 ppm by weight, relative to the weight of the polyester of the layer.

The multi-layer film may further comprise other additives conventionally employed in the manufacture of polyester films. Thus, additives such as cross-linking agents, dyes, pigments, laser additives/markers, lubricants, hydrolysis stabilisers, antioxidants, UV absorbers, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate into the base layer (B) and/or one or both of the first and second heat-sealable layers (A1) and (A2).

It is preferred, however, that the films do not comprise an organic hydrolysis stabiliser, particularly wherein at least a portion of the titanium dioxide particles are coated with said organic coating.

It is also preferred that the films do not comprise an organic UV absorber, such as a benzophenone, benzotriazole, benzoxazinone or triazine.

Each of the first and second heat-sealable layers (A1) and (A2) may also contain particulate filler. Suitable particulate fillers, where present, may be selected from the particulate fillers described above. The amount of particulate filler in a heat-sealable layer is preferably less than the amount of particulate filler in base layer (B). Preferably, a heat-sealable layer is free of particulate filler or contains particulate filler only in minor amounts. Thus, a heat-sealable layer may contain no more than 2.5% by weight, or no more than 2% by weight, or no more than 1% by weight, or no more than 0.6% by weight, or no more than about 0.3% by weight, based on the weight of the polyester in the layer. The particulate filler in a heat-sealable layer may be included for the purpose of improving handling of the film, for instance windability (i.e. the absence of blocking or sticking when the film is wound up into a roll). In a preferred embodiment, a heat-sealable layer is optically clear or translucent. As used herein, the term "optically clear" refers to a layer that provides a percentage of scattered transmitted light in the visible wavelength range of no more than 30%, preferably no more than 15% preferably no more than 10%, preferably no more than 6%, more preferably no more than 3.5% and particularly no more than 1.5%, and/or a total luminous transmission (TLT) for light in the visible region (400 nm to 700 nm) of at least 80%, preferably at least 85%, more preferably at least about 90%. Preferably, an optically clear layer fulfils both of these criteria. As used herein, the term "translucent" refers to a layer having a TLT of at least 50%, preferably at least 60%, and preferably at least 70%.

The components of a given polyester layer composition may be mixed together in conventional manner. For example, by mixing with the monomeric reactants from which the polyester is derived, or the components may be mixed with the polyester by tumble or dry blending or by compounding in an extruder, followed by cooling and, usually, comminution into granules or chips. Masterbatching technology may also be employed. Typically, the copolyesterether is fed separately to the extruder from which the polyester of the base layer (B) is extruded to form the base layer. Any optical brightener and/or blue dye may be included at any stage of the polyester or polyester film production, but is preferably added to the glycol, or alternatively to the polyester prior to the formation of the polyester film (for instance by injection during extrusion).

The intrinsic viscosity of the base layer (B) of the multi-layer film, and preferably also the first and second heat-sealable copolyester layers, is preferably at least 0.65, preferably at least 0.7, and in one embodiment in the range of from about 0.65 to about 0.75.

The thickness of the polyester base layer (B) is preferably in the range from 25 to 400 μm, more preferably at least 50 μm, more preferably at least 75 μm, more preferably at least 100 μm, more preferably 100 to 350 μm, particularly 100 to 200 μm, and especially 100 to 130 μm.

The thickness of each of the first and second heat-sealable layers (A1) and (A2) is preferably no more than 50 μm, and is preferably in the range of from about 0.5 to about 25 µm, preferably from about 3 to about 30 µm, preferably about 5 to about 25 µm, more preferably about 12 to about 18 µm.

The thickness of polyester base layer (B) is preferably greater than the thickness of each of the first and second heat-sealable layers (A1) and (A2). The thickness of polyester base layer (B) is preferably greater than 50%, preferably at least 60%, more preferably at least 70% and preferably from about 75% to about 95% of the total thickness of the film.

The first and second heat-sealable layers (A1) and (A2) typically also function as ink-receptive layers, which are layers which function to improve the adhesion of inks, dyes and/or lacquers etc. An ink-receptive layer may carry pictorial information, such as an ordinary photograph, and/or written information such as typed script, a signature etc, as appropriate. Information may be imparted to the ink-receptive layer by means of traditional printing processes such as off-set, gravure, silk screen, and flexographic printing, or by writing by hand, or by thermal transfer printing (TTP), or by laser transfer printing (LTP), or by laser engraving.

The multi-layer film described herein preferably exhibits an Elongation To Break (ETB) in each of the longitudinal and transverse directions of the film of at least 250%, preferably at least 270%, preferably at least 280%, preferably at least 290%, preferably at least 300%, and typically in the range of from about 250% to about 350%.

It will be appreciated that the terms "longitudinal direction" and "transverse direction" of the film refer to the directions in which a film was stretched during its manufacture. The term "machine direction" is also used herein to refer to the longitudinal direction.

The multi-layer film described herein exhibits a delamination resistance to an uncoated PVC overlay film, measured as described herein, of at least 5 N/cm, preferably at least 10 N/cm, preferably at least 15 N/cm, preferably at least 25 N/cm. Preferably it is impossible to peel an uncoated PVC overlay film from the multi-layer film.

The multi-layer film described herein preferably exhibits a delamination resistance to an uncoated PVC inlay film such that it is impossible to peel said uncoated PVC inlay film from the multi-layer film, tested as described herein.

The multi-layer film described herein offers particular advantages in the manufacture of laminated cards, as described hereinabove.

According to a fifth aspect of the present invention, there is provided a multi-layer card comprising a polymeric inlay layer having a first surface and a second surface, further comprising a first multi-layer film as defined in any of the first, second, third or fourth aspects of the invention and described hereinabove which is disposed on the first surface of the polymeric inlay layer, and further comprising a first polymeric overlay layer which is disposed on said first multi-layer film, such that the layer order is polymeric inlay layer, first multi-layer film, first polymeric overlay layer. Preferably, the multi-layer card further comprises a second multi-layer film according to any of the first, second, third or fourth aspects of the invention which is disposed on a second surface of the polymeric inlay layer, and preferably further comprising a second polymeric overlay layer disposed on said second multi-layer film, such that the layer order is second polymeric overlay layer, second multi-layer film, polymeric inlay layer, first multi-layer film, first polymeric overlay layer, wherein the second multi-layer film is a film according to the definition of the first multi-layer film in any of the first, second, third or fourth aspects of the invention and described hereinabove. The second multi-layer film may be the same as or different to the first multi-layer film, and is preferably the same. In other words, each of the polyester base layer and heat-sealable copolyester layers of the second multi-layer film may, independently, be the same as or different to the corresponding polyester base layer and heat-sealable copolyester layers of the first multi-layer film, but they are preferably the same. A symmetrical layer structure is preferred.

The first multi-layer film is disposed directly on the first surface of the polymeric inlay layer. The second multi-layer film is disposed directly on the second surface of the polymeric inlay layer. In other words, unlike the conventional commercially available films, there is no requirement for an intervening adhesive layer between the polymeric inlay layer and said multi-layer film.

The first polymeric overlay layer is preferably disposed directly on the surface of said first multi-layer film. The second polymeric overlay layer is preferably disposed directly on the surface of said second multi-layer film. In other words, unlike the conventional commercially available films, it is preferred that there is no intervening adhesive layer between a polymeric overlay layer and said multi-layer film. Thus, a polymeric overlay layer preferably does not comprise any adhesive coating on the surface which contacts said multi-layer film. Overlays comprising an adhesive coating may be appropriate where the printed film comprises a relatively high degree of ink coverage.

The composition of the polymeric overlay layer is suitably selected from materials which include polyester (such as PET and including copolyesters such as the TA/CHDM/EG copolyesters described hereinabove, especially wherein the glycol fraction comprises about 33:67 of CHDM:EG), polycarbonate, polyolefin, PVC, ABS and/or paper, and preferably the polymeric overlay layer is PVC. Where the multi-layer card comprises multiple polymeric overlay layers, the polymeric overlay layers may be the same as or different to each other, but are preferably the same. A polymeric overlay layer is preferably a self-supporting film. The polymeric overlay layer provides support for the card, and to provide protection, including security, for information imparted to and contained in the card. It will be appreciated that the polymeric overlay layer is suitably optically clear in order that the information imparted to and contained in the card can be read. The thickness of a polymeric overlay layer is preferably from about 25 to about 150 µm, preferably at least about 50 µm, and preferably from about 80 µm to about 120 µm.

The composition of the polymeric inlay layer is suitably selected, independently, from the materials described hereinabove for the polymeric overlay layer. The thickness of the polymeric inlay layer is preferably from about 40 to about 350 µm, preferably at least about 75 µm, preferably at least about 100 µm, typically no more than about 300 µm, and in one preferred embodiment from about 250 µm to about 300 µm. The multi-layer card according to the present invention can be used in any of the conventional card applications known in the art, including as an identification card or magnetic card, such as a credit card, and including contactless cards, pre-paid cards such as travel or telephone cards, and "smart" cards such as cards capable of storing information about financial transactions. An electronic chip may be present at the surface of the card, or encapsulated therein, for example in an epoxy material of other suitable encapsulant.

The multi-layer card preferably has a thickness in the range from 150 to 1000 µm, preferably at least about 200 µm, preferably at least about 250 µm, preferably at least about 500 μm, preferably at least about 650 μm, and preferably no more than about 900 μm, particularly no more than about 850 μm.

The multi-layer card preferably has a length in the range from 70 to 100 mm, more preferably 80 to 90 mm, and particularly about 86 mm, and a width in the range from 40 to 70 mm, more preferably 50 to 60 mm, and particularly about 54.5 mm.

The multi-layer card is preferably formed by a lamination process, by which is meant that two or more separate self-supporting film structures, which may themselves contain more than one layer, are contacted and bonded together to form the card. In the present invention, lamination is effected thermally.

It is generally desirable for a card comprising the multi-layer film(s), polymeric inlay layer and polymeric overlay layer(s) to be co-terminous along all edges.

According to a sixth aspect of the present invention, there is provided the use of the multi-layer film as defined in any of the first, second, third or fourth aspects of the present invention as one or more layer(s) (preferably an internal layer) in a multi-layer card further comprising a polymeric inlay layer and one or more polymeric cover layer(s) (also referred to as an overlay), as described herein.

According to a seventh aspect of the present invention, there is provided a multi-layer film, per se, according to the definition of the multi-layer film in any of the first, second, third and fourth aspects of the invention and described hereinabove.

According to an eighth aspect of the present invention, there is provided a multi-layer film, per se, comprising:
(i) a polyester base layer (B) comprising a crystallisable polyester ($P_B$), and further comprising titanium dioxide in an amount of from about 1 to about 30 wt % by total weight of the base layer;
(ii) a first heat-sealable copolyester layer (A1) disposed on a first surface of said polyester base layer; and
(iii) optionally a second heat-sealable copolyester layer (A2) disposed on a second surface of said polyester base layer, wherein the copolyester ($CP_A$) of each of the first and optional second heat-sealable copolyester layers is independently selected from amorphous copolyesters ($ACP_A$) derived from an aliphatic diol and a cycloaliphatic diol and at least one aromatic dicarboxylic acid, and the polyester base layer (B) further comprises a copolyester ($CP_B$) in an amount of at least about 20% by weight based on the total weight of the base layer (B).

According to a ninth aspect of the present invention, there is provided a multi-layer film, per se, comprising:
(i) a polyester base layer (B) comprising a crystallisable polyester ($P_B$), and further comprising titanium dioxide in an amount of from about 1 to about 30 wt % by total weight of the base layer; and
(ii) a first heat-sealable copolyester layer (A1) disposed on a first surface of said polyester base layer; and
(iii) optionally a second heat-sealable copolyester layer (A2) disposed on a second surface of said polyester base layer, wherein the copolyester ($CP_A$) of each of the first and optional second heat-sealable copolyester layers is independently selected from copolyesters ($I\text{-}CP_A$) derived from repeating units consisting of a first aromatic dicarboxylic acid, a second aromatic dicarboxylic acid and an aliphatic glycol; and
wherein the multi-layer film is obtained by a process comprising heat-setting at a temperature of greater than 225° C. and preferably in the range of 227 to 235° C.

It will be appreciated that the features and preferences described hereinabove in respect of each of the first, second, third and fourth aspects of the inventions are applicable to the fifth, sixth, seventh, eighth and ninth aspects of the invention. The invention is illustrated by reference to FIG. 1 showing a multi-layer card (10), in which a first multi-layer film comprising a polyester base layer (B) (2), a first heat-sealable copolyester layer (A1) (3) and a second heat-sealable copolyester layer (A2) (4) is disposed on a first surface of a polymeric inlay layer (1). A second multi-layer film comprising a polyester base layer (B) (6), a first heat-sealable copolyester layer (A1) (7) and a second heat-sealable copolyester layer (A2) (8) is disposed on the second surface of the polymeric inlay layer (1). On each of the second heat-sealable copolyester layers (A2) (4, 8), there is a disposed a polymer overlay layer (5,9).

Property Measurement

The following analyses were used to characterize the films described herein:
(i) Optical clarity is evaluated by measuring total luminance transmission (TLT) and haze (% of scattered transmitted visible light) through the total thickness of the film using an M57D spherical hazemeter (Diffusion Systems) according to the standard test method ASTM D1003.
(ii) Transmission Optical Density (TOD) is measured using a Macbeth Densitometer TR 927 (obtained from Dent and Woods Ltd, Basingstoke, UK) in transmission mode.
(iii) L*, a* and b* colour co-ordinate values (CIE (1976)), whiteness index and yellowness index is measured using a Konica Minolta CM3600a and the principles of ASTM D 313.
(iv) Intrinsic viscosity (in units of dL/g) of the polyester and polyester film is measured by solution viscometry in accordance with ASTM D5225-98(2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(v) Elongation To Break (ETB) is measured according to test method ASTM D882. Using a straight edge and a calibrated sample cutter (10 mm+\−0.5 mm) five strips (100 mm in length) of the film are cut along the machine direction. Each sample is tested using an Instron model 3111 materials test machine, using pneumatic action grips with rubber jaw faces. Temperature (23° C.) and relative humidity (50%) are controlled. The crosshead speed (rate of separation) is 25 mm·min$^{-1}$. The strain rate is 50%. Elongation to Break ($C_B$ (%)) is defined as:

$$\epsilon_B(\%) = (\text{extension at break}/L_0) \times 100$$

where $L_0$ is the original length of the sample between grips.

(vi) The delamination resistance was assessed by measuring the overlay peel strength, as follows. A4 samples of the unprinted multilayer film are laminated in the card structure according to FIG. 1 in a Carver press at 140° C. for 15 minutes at 6000 kg pressure. The overlay is an uncoated PVC film (100 µm; Bilcare Sicoplast®167). The inlay is a white uncoated PVC film (270 µm; Bilcare Sicosmart®307 T1). The laminates are then cooled to 50° C., the pressure released and the laminates removed from the press. The laminates are cut into cards (dimensions 86×54.5 mm) using an Oasys card punch cutter and the cards are then cut lengthways into strips having a width of 10 mm. The overlay peel test was conducted substantially in accordance with ISO/IEC10373-1. Thus, overlay peels are initiated by using a knife to cut a line across the 10 mm strip deep enough such that it cuts through the overlay and just into the multi-layer film. An attempt is then made to peel back the overlay from the strip. If initiated, the test strip is fixed to a card using double sided tape and the peel tail threaded through roller bars on an Instron test machine. The peel tail is clamped in the bottom jaws of the Instron machine and the top head (roller bars) moved upwards at 300 mm/min, measuring the force required to peel the overlay from the strip at a 90° angle. If the overlay peel cannot be initiated or immediately tears or snaps on peeling, no numerical data is obtainable and the sample considered as impossible to peel. Eight test strips are measured per film sample, and the overlay peel strength reported as the mean of these measurements.

(vii) The delamination resistance was also assessed by measuring the inlay peel strength using a process similar to the overlay peel test. Results from this test are reported herein qualitatively.

(viii) The water content of titanium dioxide is measured by a Karl Fischer titration, preferably a coulometric Karl Fischer titration. Typically, the sample is heated in an oven upstream of the titration cell and the released water is transferred by a flow of dry carrier gas to the titration cell where it is determined by a Karl Fischer titration. Suitably, a Metrohm 768 KF Coulometer coupled to a Metrohm 768 KF Oven is used to conduct a coulometric Karl Fischer titration.

The invention is further illustrated by reference to the following examples. The examples are not intended to limit the scope of the invention as described above.

EXAMPLES

In the following discussion, intrinsic viscosity values are those measured on the polymer chip unless otherwise specified, and reference to "PETG" is to a copolyester of terephthalic acid, 1,4-cyclohexanedimethanol and ethylene glycol (33:67 CHDM:EG) (Skygreen™ PN100 (IV=0.70)) unless otherwise specified.

Example 1

Polyester composition P1 contains:
(i) 39.3% of PET homopolymer
(ii) 40.2% of an IPA-containing PET-based copolyester (TA:IPA=82:18; IV=0.67)
(iii) 25% $TiO_2$-containing PET masterbatch containing 50% of rutile $TiO_2$ (Tioxide® TR28).
(iv) 8% copolyesterether (Hytrel® 4068; DuPont)

A multi-layer film comprising a base layer (B) of polyester composition P1 above and two outer layers A1 and A2 of PETG was extruded and cast using a standard melt coextrusion system. The coextrusion system was assembled using two independently operated extruders which fed separate supplies of polymeric melt to a standard coextrusion block or junction at which these streams were joined. From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 3 m/min and was approximately 300 mm in width. The cast extrudate was stretched in the direction of extrusion to approximately 2.9 times its original dimensions at a temperature of 82° C. The cooled stretched film was then passed into a stenter oven at a temperature of 115° C. where the film was dried and stretched in the sideways direction to approximately 3.4 times its original dimensions. The biaxially stretched film was heat-set at 210° C. The average thickness of the final film was about 158 µm and comprised three layers having an ABA structure, wherein the outer layers (A1) and (A2) were each about 17 µm thick. The optical density was 1.06; the L* value was 92.2; the whiteness index was 99.9; and the 60° gloss was 101.

The multi-layer film was made into a card having the structure shown in FIG. 1. The overlay is an uncoated PVC film (100 µm; Bilcare Sicoplast®167). The inlay is a white uncoated PVC film (270 µm; Bilcare Sicosmart®307 T1). The cards were prepared by laminating sheets of each of the layers in a Carver press at 140° C. for 15 minutes at 6000 kg pressure, cooling to 50° C., releasing the pressure, removing the laminate from the press, and cutting the laminate into cards having dimensions 86×54.5 mm. The cards were then tested for delamination resistance to the PVC overlay using the test method described herein and the average overlay peel strength was 21.2 N/cm.

The multi-layer film was also made into a card in which a single multi-layer film was laminated to the uncoated PVC overlay film as described above and the white uncoated PVC inlay film (270 µm; Bilcare Sicosmart®307 T1) described above. The cards were then tested for delamination resistance to the PVC inlay using the test method described herein and in all test samples the card was found to be impossible to peel.

Comparative Example 1

A multi-layer film similar to that described in Example 1 was prepared, except with the following significant differences:
(i) the first and second copolyester layers (A1 and A2) were an TA/IPA-copolyester (TA:IPA=82:18), rather than a PETG copolyester;
(ii) no TA/IPA-copolyester was blended into the polyester base layer (B); and
(iii) an anatase $TiO_2$ (Tioxide A-HRF) was used in the base layer, rather than a rutile $TiO_2$.

A multi-layer card was made and tested in a manner similar to that described in Example 1. This is a conventional multi-layer card which is the standard structure for currently commercially available cards, substantially in accordance with the best teaching of U.S. Pat. No. 7,232,602-B, and it was this structure on which the present inventors sought to improve. The overlay peel strength was only 2.9 N/cm, as measured in the test described hereinabove. In the inlay peel test described herein, it was easy to peel the multi-layer film away from the inlay.

Examples 2 to 15

Further multi-layer films were prepared using the procedure according to Example 1, with the differences noted in Table 1 below. The TiO$_2$ grade used was the same as for Example 1, except for Examples 4, 5, 6, 9 and 13 which used the same anatase TiO$_2$ of Comparative Example 1. The overlay peel strengths are shown in Table 1 below. The films of Examples 2, 3, 8, 9, 10, 11, 12 and 13 showed particularly strong delamination resistance to a PVC inlay (assessed using the test method described herein), and in particular Examples 2, 3, 9, 10, 11 and 12 which were found to be impossible to peel.

The results demonstrate that the cards of the present invention exhibit surprisingly superior bond strength between the multilayer film and the polymeric overlay, surprisingly improved cohesive strength in the polyester base layer, and surprisingly superior bond strength between the multi-layer film and the polymeric inlay. The best performing cards with the greatest delamination resistance are those wherein the heat-seal layer is selected from amorphous copolyesters (ACP$_A$) derived from an aliphatic diol and a cycloaliphatic diol and at least one aromatic dicarboxylic acid and wherein the polyester base layer further comprises a copolyester (CP$_B$). Without wishing to be bound by theory, the inventors believe that the use of such amorphous copolyesters (ACP$_A$) in the heat-seal layer shifts the locus of the plane of failure of the card into the polyester base layer of the multi-layer film, and the use of the copolyester (CP$_B$) and preferably also rutile titanium dioxide in the base layer increases the cohesive strength of the base layer, resulting in an unexpectedly high delamination resistance.

The cards of the present invention therefore exhibit superior security and tamper-resistance.

(iii) optionally a second heat-sealable copolyester layer (A2) disposed on a second surface of said polyester base layer, wherein the copolyester (CP$_A$) of each of the first and optional second heat-sealable copolyester layers is independently selected from amorphous copolyesters (ACP$_A$) derived from an aliphatic diol and a cycloaliphatic diol and at least one aromatic dicarboxylic acid, and/or the polyester base layer (B) further comprises a copolyester (CP$_B$) in an amount of at least about 10% by weight based on the total weight of the base layer (B), wherein the copolyester (CP$_B$) does not contain polyether segments.

2. A multi-layer card according to claim 1 wherein said first multi-layer film comprises:
   (i) a polyester base layer (B) comprising a crystallisable polyester (P$_B$), and further comprising titanium dioxide in an amount of from about 1 to about 30 wt % by total weight of the base layer; and
   (ii) a first heat-sealable copolyester layer (A1) disposed on a first surface of said polyester base layer; and
   (iii) optionally a second heat-sealable copolyester layer (A2) disposed on a second surface of said polyester base layer,
   wherein the copolyester (CP$_A$) of each of the first and optional second heat-sealable copolyester layers is independently selected from amorphous copolyesters (ACP$_A$) derived from an aliphatic diol and a cycloaliphatic diol and at least one aromatic dicarboxylic acid,

TABLE 1

| Sample | Layer A polymer | PET wt % in layer B | Copolyester in layer B | Copolyester wt % in layer B | IPA wt % in B layer | Heat-set temperature (° C.) | Overlay peel strength (N/cm) |
| --- | --- | --- | --- | --- | --- | --- | --- |
| C. Ex. 1[a] | 18% IPA co-PET | 83.9 | None | 0.0 | 0.0 | 225 | 2.9 |
| Ex. 1 | PETG | 39.3 | 18% IPA co-PET | 40.2 | 7.2 | 210 | 21.2 |
| Ex. 2 | PETG | 39.3 | 18% IPA co-PET | 40.2 | 7.2 | 220 | 23.5 |
| Ex. 3 | PETG | 39.3 | 18% IPA co-PET | 40.2 | 7.2 | 230 | 24.9 |
| Ex. 4[a] | 18% IPA co-PET | 39.3 | 18% IPA co-PET | 40.2 | 7.2 | 230 | 6.3 |
| Ex. 5[a] | 18% IPA co-PET | 83.9 | None | 0.0 | 0.0 | 230 | 5.8 |
| Ex. 6[a] | PETG | 83.9 | None | 0.0 | 0.0 | 225 | 5.0 |
| Ex. 7 | PETG | 83.9 | None | 0.0 | 0.0 | 230 | 5.8 |
| Ex. 8 | PETG | 63.9 | 18% IPA co-PET | 20.0 | 3.6 | 230 | 16.6 |
| Ex. 9[a] | PETG | 60.1 | 18% IPA co-PET | 23.8 | 4.3 | 230 | 10.4 |
| Ex. 10 | PETG | 46.0 | 18% IPA co-PET | 33.5 | 6.0 | 230 | 22.3 |
| Ex. 11 | PETG | 37.6 | 18% IPA co-PET | 41.9 | 7.5 | 230 | 25.7 |
| Ex. 12 | PETG | 30.5 | 18% IPA co-PET | 49.0 | 8.8 | 230 | 32.7 |
| Ex. 13[a] | PETG | 12.5 | 12% IPA co-PET | 71.4 | 8.6 | 200 | 8.1 |
| Ex. 14 | PETG | 67.3 | PETG + 18% IPA co-PET (50:50) | 19.4 | 1.7 | 230 | 13.6 |
| Ex. 15 | PETG | 67.3 | PETG | 19.4 | 0.0 | 230 | 13.2 |

[a]anatase TiO$_2$

The invention claimed is:

1. A multi-layer card comprising a polymeric inlay layer having a first surface and a second surface, further comprising a first multi-layer film which is disposed on the first surface of the polymeric inlay layer, and further comprising a first polymeric overlay layer which is disposed on said first multi-layer film, such that the layer order is polymeric inlay layer, first multi-layer film and first polymeric overlay layer, wherein said first multi-layer film comprises:
   (i) a polyester base layer (B) comprising a crystallisable polyester (P$_B$), and further comprising titanium dioxide in an amount of from about 1 to about 30 wt % by total weight of the base layer;
   (ii) a first heat-sealable copolyester layer (A1) disposed on a first surface of said polyester base layer; and preferably wherein the polyester base layer (B) further comprises a copolyester (CP$_B$) in an amount of at least about 10% by weight based on the total weight of the base layer (B).

3. A multi-layer card according to claim 1 wherein said first multi-layer film comprises:
   (i) a polyester base layer (B) comprising a crystallisable polyester (P$_B$), and further comprising titanium dioxide in an amount of from about 1 to about 30 wt % by total weight of the base layer; and
   (ii) a first heat-sealable copolyester layer (A1) disposed on a first surface of said polyester base layer; and
   (iii) optionally a second heat-sealable copolyester layer (A2) disposed on a second surface of said polyester base layer, wherein the polyester base layer (B) further comprises a copolyester ($CP_B$) in an amount of at least about 10% by weight based on the total weight of the base layer (B).

4. A multi-layer card according to claim 1, wherein the copolyester ($CP_A$) of the first and second heat-sealable layers (A1) and (A2) is independently selected from copolyesters containing only one aromatic dicarboxylic acid, one aliphatic glycol, and one cycloaliphatic glycol, and preferably from copolyesters derived from terephthalic acid, ethylene glycol and 1,4-cyclohexanedimethanol, preferably wherein the molar ratio of the cycloaliphatic diol to the aliphatic diol is in the range from 30:70 to 35:65.

5. A multi-layer card according to claim 3, wherein the copolyester ($CP_A$) of each of the first and optional second heat-sealable layers (A1) and (A2) is selected from copolyesters ($I-CP_A$) derived from repeating units consisting of a first aromatic dicarboxylic acid, a second aromatic dicarboxylic acid and an aliphatic glycol.

6. A multi-layer card comprising a polymeric inlay layer having a first surface and a second surface, further comprising a first multi-layer film which is disposed on the first surface of the polymeric inlay layer, and further comprising a first polymeric overlay layer which is disposed on said first multi-layer film, such that the layer order is polymeric inlay layer, first multi-layer film and first polymeric overlay layer, wherein said first multi-layer film comprises:
  (i) a polyester base layer (B) comprising a crystallisable polyester ($P_B$), and further comprising titanium dioxide in an amount of from about 1 to about 30 wt % by total weight of the base layer; and
  (ii) a first heat-sealable copolyester layer (A1) disposed on a first surface of said polyester base layer; and
  (iii) optionally a second heat-sealable copolyester layer (A2) disposed on a second surface of said polyester base layer,
  wherein the copolyester ($CP_A$) of each of the first and optional second heat-sealable copolyester layers is independently selected from copolyesters ($I-CP_A$) derived from repeating units consisting of a first aromatic dicarboxylic acid, a second aromatic dicarboxylic acid and an aliphatic glycol; and
wherein said first multi-layer film is obtained by a process comprising heat-setting at a temperature of greater than 225° C. and preferably in the range of 227 to 235° C.

7. A multi-layer card according to claim 5, wherein the copolyester ($CP_A$) is selected from copolyesters derived from terephthalic acid, isophthalic acid and ethylene glycol, preferably wherein the isophthalic acid is present in an amount of from about 10 to from about 20 mol % or from about 15 to about 20 mol % or from about 10 to about 15 mol % of the acid fraction of the copolyester.

8. A multi-layer card according to claim 1, wherein the crystallisable polyester ($P_B$) of the base layer is selected from polyethylene terephthalate (PET) and polyethylene 2,6-naphthalate (PEN).

9. A multi-layer card according to claim 1, wherein the polyester base layer comprises a copolyester $CP_B$ derived from repeating units consisting of one or more aromatic dicarboxylic acid(s) and one or more diols selected from aliphatic diols and cycloaliphatic diols, and optionally one or more aliphatic dicarboxylic acid(s), and preferably said copolyester is selected from (i) copolyesters derived from repeating units consisting of a first aromatic dicarboxylic acid, a second aromatic dicarboxylic acid and an aliphatic glycol; and (ii) copolyesters derived from repeating units consisting of an aromatic dicarboxylic acid, an aliphatic glycol and a cycloaliphatic glycol.

10. A multi-layer card according to claim 1, wherein copolyester $CP_B$ is selected from (i) a copolyester derived from repeating units consisting of terephthalic acid, isophthalic acid and ethylene glycol, preferably wherein the isophthalic acid is present in an amount of from about 10 to about 20 mol % or from about 15 to about 20 mol % or from about 10 to about 15 mol % of the acid fraction of the copolyester; and (ii) a copolyester derived from repeating units consisting of terephthalic acid, ethylene glycol and 1,4-cyclohexanedimethanol, preferably wherein the molar ratio of the 1,4-cyclohexanedimethanol to the ethylene glycol is in the range from 30:70 to 35:65.

11. A multi-layer card according to claim 1, wherein copolyester $CP_B$ is present in the base layer in amounts of no more than about 75%, preferably at least about 20%, preferably at least about 30%, preferably at least about 35% by weight, based on the total weight of the base layer (B), and/or wherein where the copolyester $CP_B$ is derived from repeating units consisting of a first aromatic dicarboxylic acid, a second aromatic dicarboxylic acid and an aliphatic glycol the total amount of said second aromatic dicarboxylic acid in the polyester base layer is from about 3 to about 15 wt % by total weight of the base layer.

12. A multi-layer card according to claim 1, wherein the polyester base layer further comprises a copolyesterether, preferably in an amount of from about 0.2 to about 10 wt % relative to the total weight of the polyester base layer.

13. A multi-layer card according to claim 12, wherein the copolyesterether comprises at least one polyester block and at least one polyether block wherein the ratio of polyester:polyether is in the range 25-55: 45-75 by weight % of the copolyesterether.

14. A multi-layer card according to claim 12, wherein the copolyesterether comprises at least one polyester block of an alkylene terephthalate, and wherein the copolyesterether comprises at least polyether block which is a poly(alkylene oxide) glycol selected from poly(ethylene oxide) glycol, poly(propylene oxide) glycol and poly(tetramethylene oxide) glycol.

15. A multi-layer card according to claim 1, wherein the polyester base layer (B) is oriented, preferably biaxially oriented, and/or wherein the first heat-sealable layer and the optional second heat-sealable layer are amorphous.

16. A multi-layer card according to claim 1, wherein said first multi-layer film is a coextruded multi-layer film.

17. A multi-layer card according to claim 1, wherein said first multi-layer film is opaque, and preferably exhibits a Transmission Optical Density (TOD) of at least 1.0.

18. A multi-layer card according to claim 1, wherein said first multi-layer film is white, and preferably exhibits a whiteness index of at least 85, and/or wherein said first multi-layer film exhibits an L* value of greater than 92.00; and an a* value in the range from −2.00 to −0.50; and a b* value in the range from −4.00 to −1.00.

19. A multi-layer film comprising:
  (i) a polyester base layer (B) comprising a crystallisable polyester ($P_B$), and further comprising titanium dioxide in an amount of from about 1 to about 30 wt % by total weight of the base layer;
  (ii) a first heat-sealable copolyester layer (A1) disposed on a first surface of said polyester base layer; and
  (iii) optionally a second heat-sealable copolyester layer (A2) disposed on a second surface of said polyester base layer, wherein the copolyester ($CP_A$) of each of the first and optional second heat-sealable copolyester layers is independently selected from amorphous copolyesters ($ACP_A$) derived from an aliphatic diol and a cycloaliphatic diol and at least one aromatic dicarboxylic acid, and the polyester base layer (B) further comprises a copolyester ($CP_B$) in an amount of at least about 20% by weight based on the total weight of the base layer (B) wherein the copolyester ($CP_B$) does not contain polyether segments.

20. A multi-layer film comprising:
(i) a polyester base layer (B) comprising a crystallisable polyester ($P_B$), and further comprising titanium dioxide in an amount of from about 1 to about 30 wt % by total weight of the base layer; and
(ii) a first heat-sealable copolyester layer (A1) disposed on a first surface of said polyester base layer; and
(iii) optionally a second heat-sealable copolyester layer (A2) disposed on a second surface of said polyester base layer,
wherein the copolyester ($CP_A$) of each of the first and optional second heat-sealable copolyester layers is independently selected from copolyesters ($I\text{-}CP_A$) derived from repeating units consisting of a first aromatic dicarboxylic acid, a second aromatic dicarboxylic acid and an aliphatic glycol; and
wherein the multi-layer film is obtained by a process comprising heat-setting at a temperature of greater than 225° C. and preferably in the range of 227 to 235° C.

* * * * *